(12) United States Patent
Li et al.

(10) Patent No.: US 9,704,937 B2
(45) Date of Patent: Jul. 11, 2017

(54) PIXEL STRUCTURE HAVING HIGH APERTURE RATIO AND CIRCUIT

(71) Applicant: Shenzhen China Star Optoelectronics Technology Co., Ltd., Shenzhen, Guangdong (CN)

(72) Inventors: Wenhui Li, Guangdong (CN); Changcheng Lo, Guangdong (CN); Chihyuan Tseng, Guangdong (CN); Yutong Hu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 21 days.

(21) Appl. No.: 14/426,987

(22) PCT Filed: Sep. 19, 2014

(86) PCT No.: PCT/CN2014/086890
§ 371 (c)(1),
(2) Date: Mar. 9, 2015

(87) PCT Pub. No.: WO2016/033839
PCT Pub. Date: Mar. 10, 2016

(65) Prior Publication Data
US 2016/0247869 A1    Aug. 25, 2016

(30) Foreign Application Priority Data

Sep. 2, 2014  (CN) .......................... 2014 1 0443931

(51) Int. Cl.
*H01L 27/32*  (2006.01)
*G09G 3/32*  (2016.01)
(Continued)

(52) U.S. Cl.
CPC .......... *H01L 27/3265* (2013.01); *G09G 3/32* (2013.01); *G09G 3/3225* (2013.01); *H01L 27/32* (2013.01);
(Continued)

(58) Field of Classification Search
CPC ... H01L 27/3265; H01L 29/786; H01L 27/32; H01L 27/3246; H01L 27/3248;
(Continued)

(56) References Cited

U.S. PATENT DOCUMENTS 8,102,476 B2 *  1/2012  Son ................... G02F 1/136213
                                                           349/14
8,569,762 B2 * 10/2013  Ha ...................... H01L 27/3279
                                                           257/59
(Continued)

FOREIGN PATENT DOCUMENTS

CN          1620206 A       5/2005
CN        101763821 A       6/2010
CN        103839973 A       6/2014

*Primary Examiner* — Galina Yushina
(74) *Attorney, Agent, or Firm* — Andrew C. Cheng (57) ABSTRACT

A pixel circuit and a pixel structure having high aperture ratio are provided. A first gate electrode, a layer including a first source electrode and a first drain electrode, and an etching stopper layer, a first semiconductor layer, and a gate isolation layer sandwiched between the first gate electrode and the layer of the first source electrode and the first drain electrode construct a first thin film transistor. A second gate electrode, a layer including a second source electrode and a second drain electrode, and an etching stopper layer, a second semiconductor layer, and the gate isolation layer sandwiched between the second gate electrode and the layer of the second source electrode and the second drain electrode construct a second thin film transistor. A transparent electrode, a pixel electrode and a flat isolation layer sand-
(Continued)

wiched between the transparent electrode and the pixel electrode construct a transparent capacitor.

7 Claims, 6 Drawing Sheets

(51) Int. Cl.
 *H01L 29/786* (2006.01)
 *G09G 3/3225* (2016.01)
(52) U.S. Cl.
 CPC ...... *H01L 27/3248* (2013.01); *H01L 27/3262* (2013.01); *H01L 27/3276* (2013.01); *H01L 29/786* (2013.01); *G09G 2300/0465* (2013.01); *G09G 2300/0809* (2013.01); *H01L 27/3246* (2013.01)
(58) Field of Classification Search
 CPC ............ H01L 27/3262; H01L 27/3244; H01L 27/3241; H01L 27/3225; G09G 3/32; G09G 3/00; G09G 3/3225
 See application file for complete search history.

(56) References Cited

U.S. PATENT DOCUMENTS

| | | | |
|---|---|---|---|
| 2011/0215329 A1* | 9/2011 | Chung | H01L 51/52 257/59 |
| 2013/0161612 A1* | 6/2013 | Kakkad | H01L 27/13 257/43 |
| 2014/0367664 A1* | 12/2014 | Park | H01L 27/3276 257/40 |
| 2015/0070643 A1* | 3/2015 | Kim | G02F 1/136213 349/139 |
| 2015/0207094 A1* | 7/2015 | Hwang | H01L 51/5203 257/88 |

* cited by examiner

PIXEL STRUCTURE HAVING HIGH APERTURE RATIO AND CIRCUIT

FIELD OF THE INVENTION

The present invention relates to a display technology field, and more particularly to a pixel structure having high aperture ratio and a circuit.

BACKGROUND OF THE INVENTION

A flat panel display possesses advantages of being ultra thin, power saved and radiation free and has been widely utilized. Present flat panel displays mainly comprise a LCD (Liquid Crystal Display) or an OLED (Organic Light Emitting Display).

An Organic Light Emitting Diodes Display possesses outstanding properties of self-illumination, no required back light, high contrast, being ultra thin, wide view angle, fast response, being applicable for flexible panel, wide usage temperature range, simple structure and manufacture process and etc., therefore, it is considered to be a new applicable technology for the next generation flat panel display.

Figure 1:
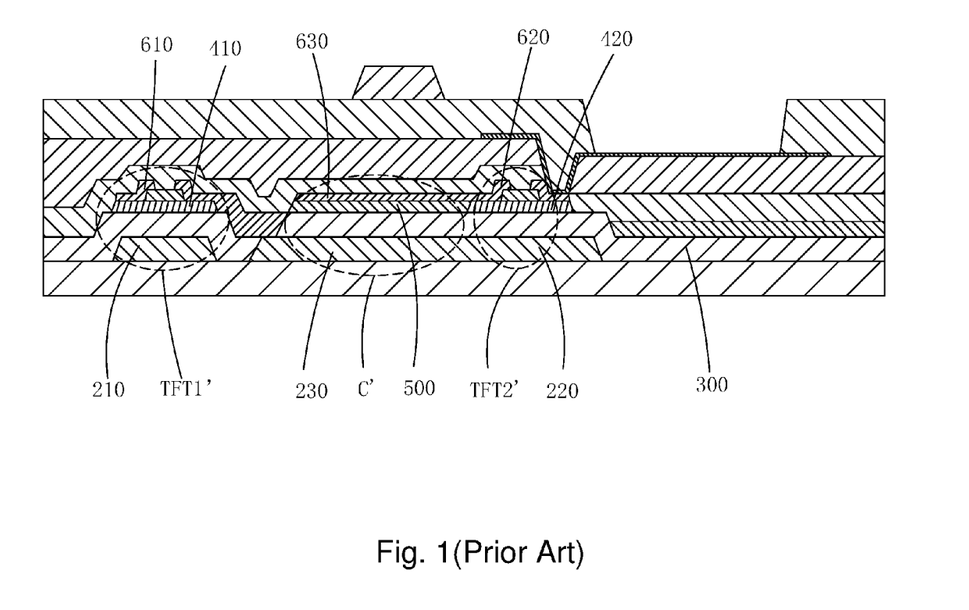
FIG. 1 is a sectional diagram of a pixel structure according to prior art.

The OLEDs can be categorized as PM-OLED (Passive matrix OLED) and AM-OLED (Active matrix OLED). The AM-OLED panels belong to active display type, and require manufacturing pixel structures in array on the array substrate. As shown in FIG. 1, generally in each of the pixel structures in the present AM-OLED, two Thin Film Transistors (TFT) sandwich a storage capacitor in-between. Specifically, the first thin film transistor TFT1' comprises a first gate electrode 210, a first source electrode/a first drain electrode 610 and an etching stopper layer 500, a first semiconductor layer 410, a gate isolation layer 300 sandwiched in-between; the second thin film transistor TFT2' comprises a second gate electrode 220, a second source electrode/a second drain electrode 620 and an etching stopper layer 500, a second semiconductor layer 420, a gate isolation layer 300 sandwiched in-between; the storage capacitor C' comprises a first metal electrode 230 formed by the first and the second gate electrodes 210, 220, and a second metal electrode 630 formed by the first source electrode/the first drain electrode, the second source electrode/the second drain electrode 610, 620, and the etching stopper layer 500 and the gate isolation layer 300 sandwiched between the two electrodes. Because the metal material shields the light and blocks the penetration of the light, the first and the second thin film transistors TFT1', TFT2' and the storage capacitor C' must occupy a certain area of the pixel, which leads to a reduced activation area of the pixel, meaning an aperture ratio is reduced. It enormously restricts the usage ratio of the light. Particularly as for the high resolution, bottom emitting AM-OLED, the decrease of the aperture ratio gets even worse, which easily causes problems of the insufficient brightness and over large power consumption.

Figure 2:
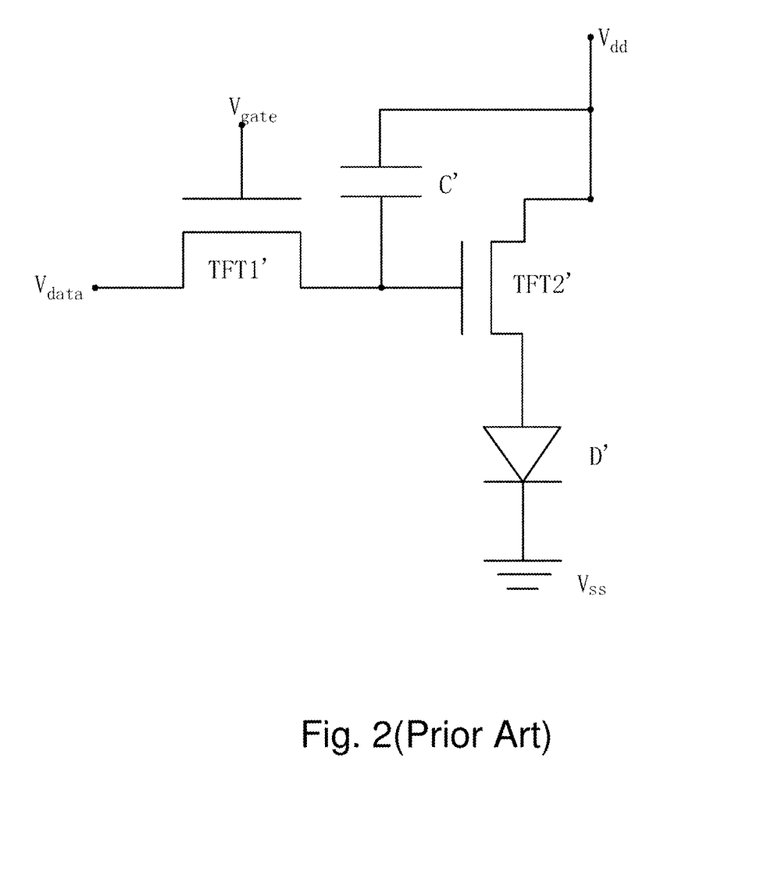
FIG. 2 is an equivalent circuit diagram of the pixel structure shown in FIG. 1.

FIG. 2 is an equivalent circuit diagram of FIG. 1. The first thin film transistor TFT1' is employed as a single switch thin film transistor. The second thin film transistor TFT2' is employed as a drive thin film transistor. Specifically, a gate electrode of the first thin film transistor TFT1' is coupled to a gate drive voltage signal $V_{gate}$, and a source electrode thereof is coupled to a data drive voltage signal $V_{data}$, and a drain electrode thereof is coupled to a gate electrode of the second thin film transistor TFT2'; a source electrode of the second thin film transistor TFT2' is coupled to a drive voltage signal $V_{dd}$, and a drain electrode thereof is coupled to an anode of the organic light emitting diode D; a cathode of the organic light emitting diode D is coupled to a ground signal $V_{ss}$; one electrode of the storage capacitor C' is coupled to the gate electrode of the second thin film transistor TFT2', and the other electrode thereof is coupled to the source electrode of the second thin film transistor TFT2'.

The working principle of the circuit is: when the gate drive voltage signal $V_{gate}$ is present, the first thin film transistor TFT1' is conducted, and the data drive voltage signal $V_{data}$ is inputted to the gate electrode of the second thin film transistor TFT2' and the second thin film transistor TFT2' is conducted. The drive voltage signal, $V_{dd}$, droves the organic light emitting diode D to display after being amplified by the second thin film transistor TFT2'. When the gate drive voltage signal $V_{gate}$ disappears, the storage capacitor C' is a major means to maintain the voltage level of the pixel electrode.

SUMMARY OF THE INVENTION

An objective of the present invention is to provide a pixel structure having high aperture ratio, capable of increasing the activation area of the pixel and raising the aperture ratio to increase the display brightness and reduce the power consumption.

Another objective of the present invention is to provide a circuit of a pixel structure having high aperture ratio, beneficial to raise the aperture ratio and promote the display effect.

For realizing the aforesaid objective, the present invention first provides a pixel structure having high aperture ratio, comprising a substrate, a first gate electrode and a second gate electrode, located above one region of the substrate; a gate isolation layer, located on the first gate electrode, the second gate electrode and the substrate, such that the gate isolation layer completely covers the first gate electrode, substantially covers the substrate, and exposes two ends of the second gate electrode; a first semiconductor layer, located on the gate isolation layer and right over the first gate electrode; a second semiconductor layer, located on the gate isolation layer and right over the second gate electrode; an etching stopper layer, located on the first semiconductor layer, the second semiconductor layer and the gate isolation layer; a first source electrode and a first drain electrode, located on the first semiconductor layer and the etching stopper layer; a second source electrode and a second drain electrode, located on the second semiconductor layer and the etching stopper layer, such that the first source electrode and first drain electrode are connected to the first semiconductor layer and one of the first source electrode and the first drain electrode is connected to one of the exposed ends of the second gate electrode, and the second source electrode and the second drain are connected to the second semiconductor layer; a protective layer, located on the first source electrode, the first drain electrode, the second source electrode, the second drain electrode and the etching stopper layer; a transparent electrode, located on the protective layer and above another region of the substrate, such that the transparent electrode is connected to the other one of the exposed ends of the second gate electrode; an isolation layer with a flat top surface, located on the protective layer and the transparent electrode; a pixel electrode, located on the isolation layer with the flat top surface, such that the pixel electrode is connected to one of the second source electrode and the second drain electrode and overlaps with the transparent electrode; a pixel definition layer, located on the isolation layer with the flat top surface and the pixel electrode, such that the pixel definition layer comprises an opening corresponding to an overlapping district of the pixel electrode and the transparent electrode; wherein the first gate electrode, a layer of the first source electrode and the first drain electrode, and the etching stopper layer, the first semiconductor layer, and the gate isolation layer sandwiched between the first gate electrode and the layer of the first source electrode and the first drain electrode construct a first thin film transistor; the second gate, a layer of the second source electrode and the second drain electrode, and the etching stopper layer, the second semiconductor layer, and the gate isolation layer sandwiched between the second gate electrode and the layer of the second source electrode and the second drain electrode construct a second thin film transistor; and the transparent electrode, the pixel electrode and the flat isolation layer sandwiched transparent electrode and the pixel electrode construct a transparent capacitor.

The transparent capacitor constructs an activation area part of the pixel structure.

The transparent electrode is an indium tin oxide (ITO) transparent electrode or an indium zinc oxide (IZO) transparent electrode, and the pixel electrode is an ITO pixel electrode or an IZO pixel electrode.

The pixel structure having high aperture ratio further comprises a photoresist spacer located on the pixel definition layer.

The pixel structure having high aperture ratio further comprises a first top gate electrode right over the first gate electrode and between the protective layer and the isolation layer with the flat top surface, and a second top gate electrode right over the second gate electrode and between the protective layer and the isolation layer with the flat top surface.

The first and second top gate electrodes and the transparent electrode are formed at the same time.

The first semiconductor layer is an indium gallium zinc oxide (IGZO) semiconductor layer, and the second semiconductor layer is an IGZO semiconductor layer.

The present invention further provides a circuit of a pixel structure having high aperture ratio, comprising a first thin film transistor, a second thin film transistor, a transparent capacitor, and an organic light emitting diode, wherein the transparent capacitor comprises two electrodes that are both transparent electrodes; the first thin film transistor comprises a gate electrode that is coupled to a gate drive voltage signal, a source electrode that is coupled to a data drive voltage signal, and a drain electrode coupled to a gate electrode of the second thin film transistor; a source electrode of the second thin film transistor is coupled to a drive voltage signal, and a drain of the second thin film transistor is coupled to an anode of the organic light emitting diode; a cathode of the organic light emitting diode is coupled to a ground signal; and one of the two electrodes of the transparent capacitor is coupled to the gate electrode of the second thin film transistor, and the other one of the two electrodes of the transparent capacitor is coupled to one of the source electrode and the drain electrode of the second thin film transistor.

The circuit of the pixel structure having high aperture ratio further comprises an opaque capacitor, and one electrode of the opaque capacitor is coupled to the gate electrode of the second thin film transistor, and the other electrode of the opaque capacitor is coupled to one of the source electrode and the drain electrode of the second thin film transistor.

The source electrode and the drain electrode of the first thin film transistor are switchable, and the source electrode and the drain electrode of the second thin film transistor are also switchable.

The benefits of the present invention are: according to the pixel structure having high aperture ratio of the present invention, by arranging the transparent capacitor constructed by the transparent electrode and the pixel electrode, and the transparent capacitor is employed as the activation area part for increasing the activation area of the pixel and raising the aperture ratio to increase the display brightness and reduce the power consumption. According to the circuit of the pixel structure having high aperture ratio provided by the present invention, the aperture ratio can be raised and the display effect can be promoted by arranging the transparent capacitor.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

In order to better understand the characteristics and technical aspect of the invention, please refer to the following detailed description of the present invention is concerned with the diagrams.

Figure 3:
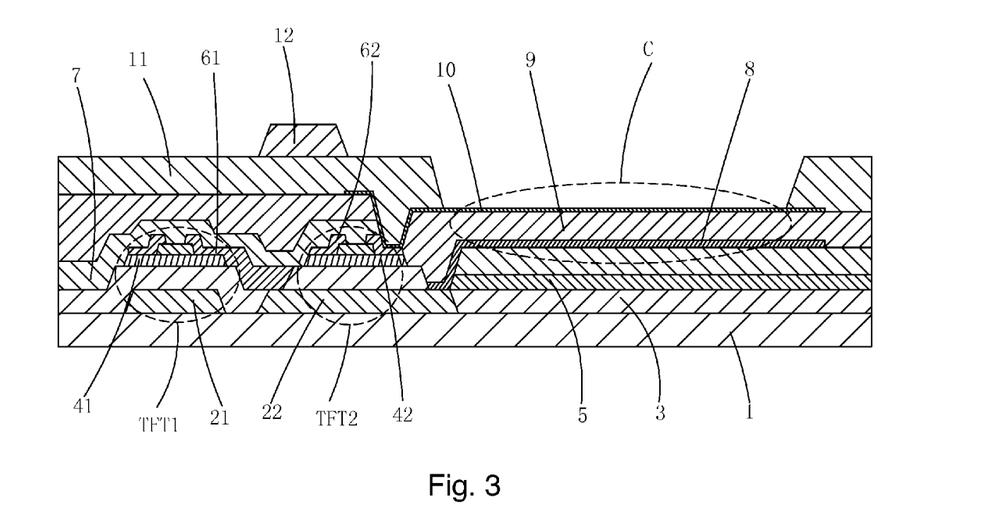
FIG. 3 is a sectional diagram of a pixel structure having high aperture ratio according to the first embodiment of the present invention.

The present invention first provides a pixel structure having high aperture ratio and FIG. 3 shows the first embodiment thereof. The pixel structure having high aperture ratio comprises a substrate 1, wherein the substrate 1 can be a glass substrate or a plastic substrate;

a first gate electrode 21 and a second gate electrode 22, located above one region of the substrate 1 and on the substrate 1, wherein the first gate electrode 21 and the second gate electrode 22 are formed with the same first metal film layer which has been patterned;

a gate isolation layer 3 located on the first gate electrode 21, the second gate electrode 22 and the substrate 1 such that the gate isolation layer 3 completely covers the first gate electrode 21, substantially covers the substrate 1, and exposes two ends of the second gate electrode 22;

a first semiconductor layer 41, located on the gate isolation layer 3 and right over the first gate electrode 21; a second semiconductor layer 42, located on the gate isolation layer 3 and right over the second gate electrode 22; wherein the first semiconductor layer 41 and the second semiconductor layer 42 are formed with the same semiconductor layer which has been patterned;

an etching stopper layer 5, located on the first semiconductor layer 41, the second semiconductor layer 42 and the gate isolation layer 3;

a first source electrode and a first drain electrode 61, located on the first semiconductor layer 41 and the etching stopper layer 5; a second source electrode and a second drain electrode 62, located on the second semiconductor layer 42 and the etching stopper layer 5 wherein the first source electrode and the first drain electrode 61 and the second source electrode and the second drain electrode 62 are formed with the same second metal film layer which has been patterned; and the first source electrode and the first drain electrode 61 are connected to the first semiconductor layer 41 and one of the first source electrode and the first drain electrode is connected to one of the two exposed ends of the second gate 22, and the second source electrode and the second drain electrode 62 are connected to the second semiconductor layer 42;

a protective layer 7, located on the first source electrode, the first drain electrode, the second source electrode, the second drain electrode and the etching stopper layer 5;

a transparent electrode 8, located on the protective layer 7 and above another region of the substrate 1, such that the transparent electrode 8 is connected to the other one of the two exposed ends of the second gate 22;

an isolation layer 9 having a flat top surface, located on the protective layer 7 and the transparent electrode 8;

a pixel electrode 10, located on the isolation layer 9, such that the pixel electrode 10 is connected to one of the second source electrode and the second drain electrode 62 and overlaps with the transparent electrode 8;

a pixel definition layer 11, located on the isolation layer 9 and the pixel electrode 10, such that the pixel definition layer 11 comprises an opening corresponding to an overlapping district of the pixel electrode 10 and the transparent electrode 8;

and a photoresist spacer 12 located on the pixel definition layer 11.

The first gate 21, the layer of the first source electrode and the first drain electrode 61, with the etching stopper layer 5, the first semiconductor layer 41, and the gate isolation layer 3 sandwiched in-between the first gate electrode and the layer of the first source electrode and the first drain electrode construct a first thin film transistor TFT1; the second gate 22, the layer of the second source electrode and the second drain electrode 62, with the etching stopper layer 5, the second semiconductor layer 42, and the gate isolation layer 3 sandwiched in between the second gate electrode and the layer of the second source electrode and the second drain electrode construct a second thin film transistor TFT2; and the transparent electrode 8, the pixel electrode 10 and the flat isolation layer 9 sandwiched between the transparent electrode and the pixel electrode construct a transparent capacitor C.

Specifically, the first semiconductor layer 41 is an Indium Gallium Zinc Oxide (IGZO) semiconductor layer, and the second semiconductor layer 42 is an IGZO semiconductor layer.

The transparent electrode 8 is an Indium Tin Oxide (ITO) transparent electrode or an Indium Zinc Oxide (IZO) transparent electrode and the transparent electrode 8 can be manufactured to have various shapes; the pixel electrode 10 is an ITO pixel electrode or an IZO pixel electrode.

Both the transparent electrode 8 and the pixel electrode 10 are transparent which light can pass through. The transparent capacitor C constructs the activation area part of the pixel structure and is capable of increasing the activation area of the pixel and raising the aperture ratio to increase the display brightness and reduce the power consumption.

Significantly, the transparent capacitor C may completely replace opaque capacitors constructed by two metal electrodes according to the prior art, or partially replacing the opaque capacitors, both helping increase the activation area of the pixels and raising the aperture ratio.

Figure 4:
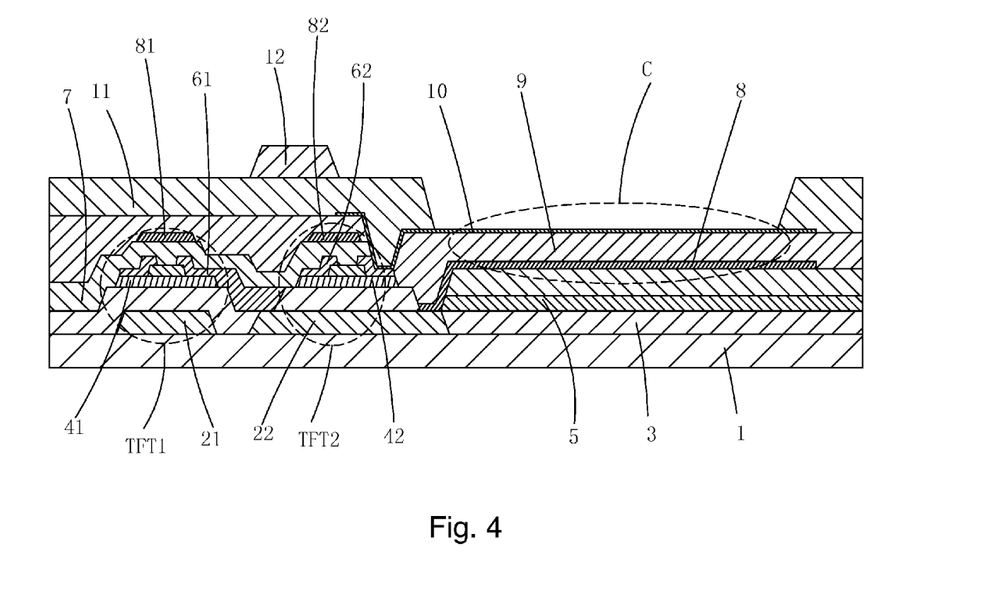
FIG. 4 is a sectional diagram of a pixel structure having high aperture ratio according to the second embodiment of the present invention.

Please refer to FIG. 4, which is the second embodiment of the pixel structure having high aperture according to the present invention. The differences of the second embodiment from the first embodiment are that the pixel structure having high aperture ratio further comprises a first top gate electrode 81 right over the first gate electrode 21 and between the protective layer 7 and the isolation layer 9, and a second top gate electrode 82 right over the second gate electrode 22 and between the protective layer 7 and the isolation layer 9. Correspondingly, both the first thin film transistor TFT1 and the second thin film transistor TFT2 comprise a double gate structure. For making the most of the manufacture process and raising the production efficiency, the first and second top gate electrodes 81, 82 and the transparent electrode 8 are formed in the same manufacture process at the same time. The material of the first and second top gate electrodes 81, 82 and the material of the transparent electrode 8 are the same, which is ITO or IZO. Other materials are the same as the first embodiment. A repeated description is omitted here.

Figure 5:
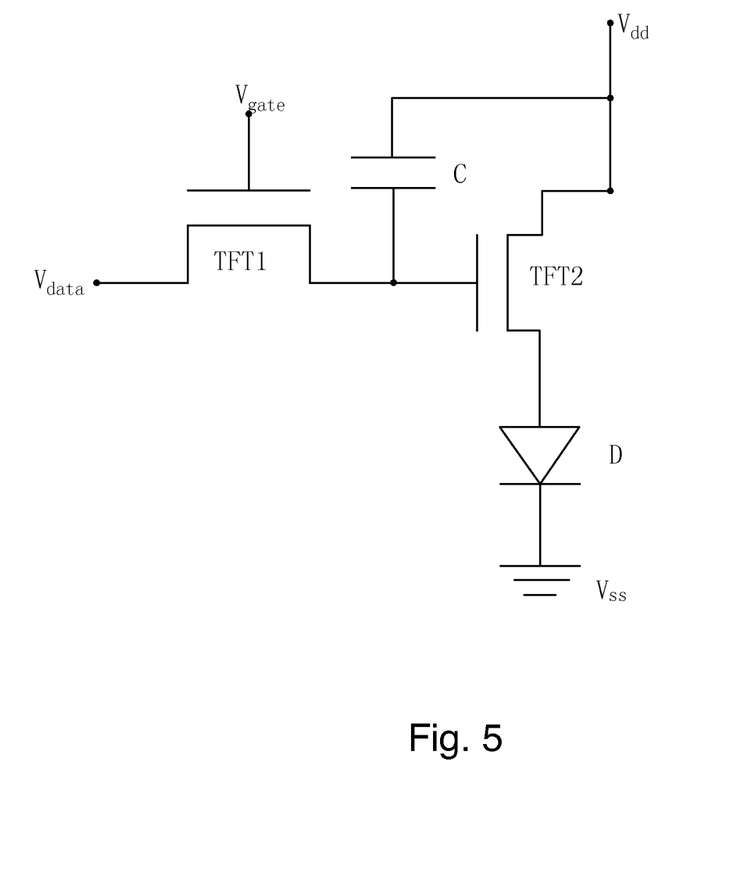
FIG. 5 is a schematic diagram of a circuit of a pixel structure having high aperture ratio according to the first embodiment of the present invention.

The present invention further provides a circuit of a pixel structure having high aperture ratio. FIG. 5 shows the first embodiment of the circuit, comprising a first thin film transistor TFT1, a second thin film transistor TFT2, a transparent capacitor C, and an organic light emitting diode D. Two electrodes of the transparent capacitor C are both transparent electrodes.

The first thin film transistor TFT1 comprises a gate electrode that is coupled to a gate drive voltage signal $V_{gate}$, a source electrode that is coupled to a data drive voltage signal $V_{data}$, and a drain electrode that is coupled to a gate electrode of the second thin film transistor TFT2; a source electrode of the second thin film transistor TFT2 is coupled to a drive voltage signal $V_{dd}$, and a drain electrode of the second thin film transistor is coupled to an anode of the organic light emitting diode D; a cathode of the organic light emitting diode D is coupled to a ground signal $V_{ss}$; one of the two electrodes of the transparent capacitor C is coupled to the gate electrode of the second thin film transistor TFT2, and the other one of the two electrodes is coupled to the source electrode of the second thin film transistor TFT2.

The first thin film transistor TFT1 is employed as a signal switch thin film transistor, and the second thin film transistor TFT2 is employed as a drive thin film transistor. The working principle of the circuit is: when the gate drive voltage signal $V_{gate}$ is present, the first thin film transistor TFT1 is conducted, and the data drive voltage signal $V_{data}$ is inputted to the gate electrode of the second thin film transistor TFT2 and the second thin film transistor TFT2 is conducted. The drive voltage signal, $V_{dd}$, drives the organic light emitting diode D to display after being amplified by the second thin film transistor TFT2. When the gate drive voltage signal $V_{gate}$ disappears, the transparent capacitor C is employed to maintain the voltage level of the pixel electrode.

The aperture ratio can be raised and the display effect can be promoted because the transparent capacitor C is arranged in the circuit.

Figure 6:
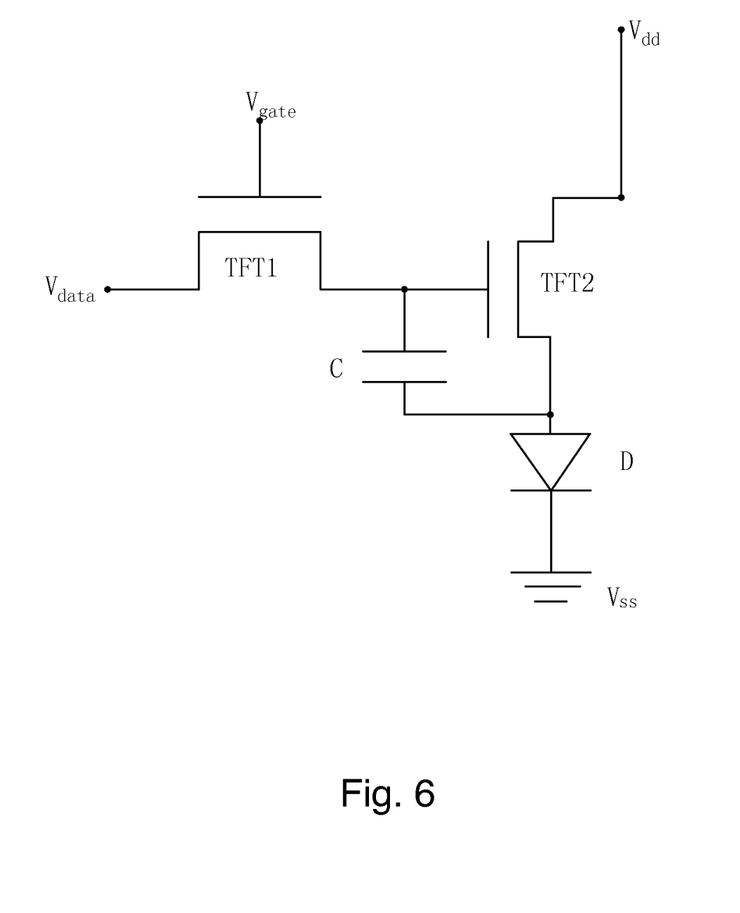
FIG. 6 is a schematic diagram of a circuit of a pixel structure having high aperture ratio according to the second embodiment of the present invention.

Please refer to FIG. 6, which is the second embodiment of the circuit of the pixel structure having high aperture according to the present invention. The differences of the second embodiment from the first embodiment are that one of the two electrodes of the transparent capacitor C is coupled to the gate electrode of the second thin film transistor TFT2, and the other one of the two electrodes is coupled to the drain electrode of the second thin film transistor TFT2. The other parts are configured to be the same as those of the first embodiment. A repeated description is omitted here.

Figure 7:
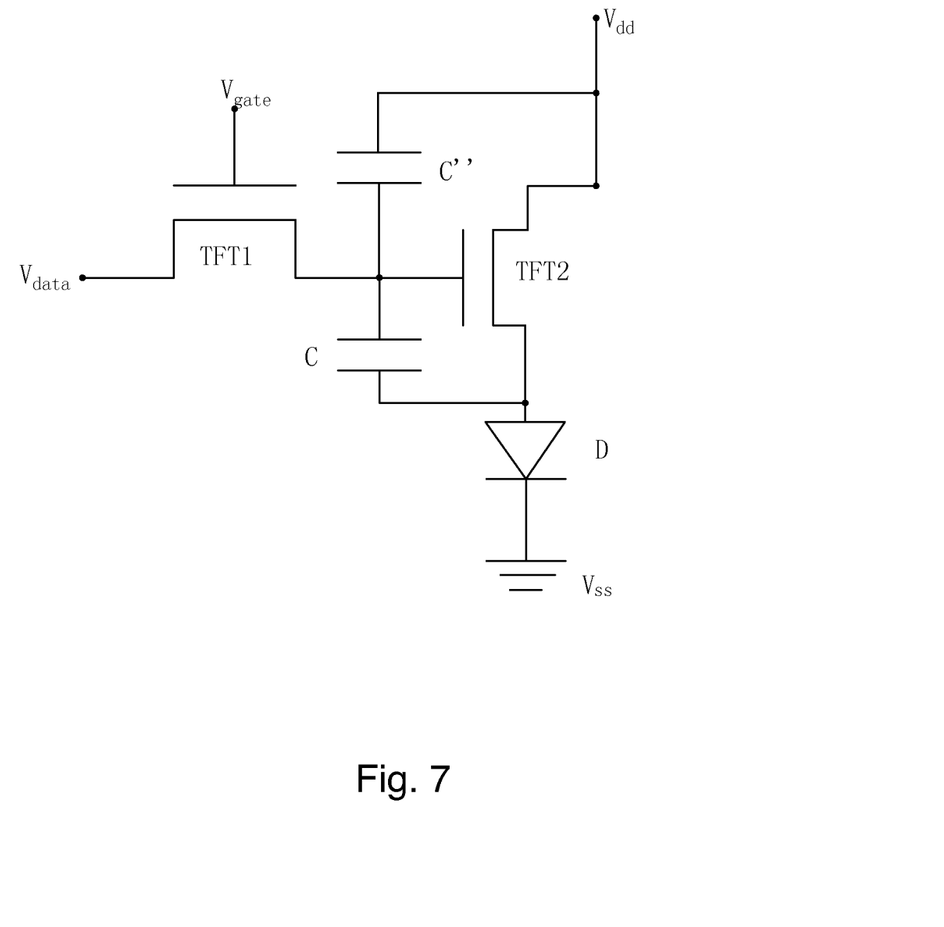
FIG. 7 is a schematic diagram of a circuit of a pixel structure having high aperture ratio according to the third embodiment of the present invention.

Please refer to FIG. 7, which is the third embodiment of the circuit of the pixel structure having high aperture according to the present invention. The differences of the third embodiment from the first embodiment are that one of the two electrodes of the transparent capacitor C is coupled to the gate electrode of the second thin film transistor TFT2, and the other one of the two electrodes is coupled to the drain electrode of the second thin film transistor TFT2, and an opaque capacitor C" is further included, wherein one electrode of the opaque capacitor C" is coupled to the gate electrode of the second thin film transistor TFT2, and the other electrode of the opaque capacitor is coupled to the source electrode of the second thin film transistor TFT2.

The source electrode and the drain electrode of the first thin film transistor TFT1 are switchable, and the source electrode and the drain electrode of the second thin film transistor TFT2 are switchable, too. Therefore, in the third embodiment, the one electrode of the transparent capacitor C can be coupled to the gate electrode of the second thin film transistor TFT2, and the other electrode of the transparent capacitor is coupled to the source electrode of the second thin film transistor TFT2, and the one electrode of the opaque capacitor C" can be coupled to the gate electrode of the second thin film transistor TFT2, and the other electrode of the opaque capacitor can be coupled to the drain electrode of the second thin film transistor TFT2. The other parts are configured to be the same as those of the first embodiment. A repeated description is omitted here.

In conclusion, according to the pixel structure having high aperture ratio of the present invention, by arranging the transparent capacitor constructed by the transparent electrode and the pixel electrode, and the transparent capacitor is employed as the activation area part for increasing the activation area of the pixel and raising the aperture ratio to increase the display brightness and reduce the power consumption. According to the circuit of the pixel structure having high aperture ratio provided by the present invention, the aperture ratio can be raised and the display effect can be promoted by arranging the transparent capacitor.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A pixel structure having high aperture ratio, comprising a substrate, a first gate electrode and a second gate electrode, located above one region of the substrate; a gate isolation layer, located on the first gate electrode, the second gate electrode and the substrate, such that the gate isolation layer completely covers the first gate electrode, substantially covers the substrate, and exposes two ends of the second gate electrode; a first semiconductor layer, located on the gate isolation layer and right over the first gate electrode; a second semiconductor layer, located on the gate isolation layer and right over the second gate electrode; an etching stopper layer, located on the first semiconductor layer, the second semiconductor layer and the gate isolation layer; a first source electrode and a first drain electrode, located on the first semiconductor layer and the etching stopper layer; a second source electrode and a second drain electrode, located on the second semiconductor layer and the etching stopper layer, such that the first source electrode and first drain electrode are connected to the first semiconductor layer and one of the first source electrode and the first drain electrode is connected to one of the exposed ends of the second gate electrode, and the second source electrode and the second drain are connected to the second semiconductor layer; a protective layer, located on the first source electrode, the first drain electrode, the second source electrode, the second drain electrode and the etching stopper layer; a transparent electrode, located on the protective layer and above another region of the substrate, such that the transparent electrode is connected to the other one of the two exposed ends of the second gate electrode; an isolation layer with a flat top surface, located on the protective layer and the transparent electrode; a pixel electrode, located on the isolation layer with the flat top surface, such that the pixel electrode is connected to one of the second source electrode and the second drain electrode and overlaps with the transparent electrode; a pixel definition layer, located on the isolation layer with the flat top surface and the pixel electrode, such that the pixel definition layer comprises an opening corresponding to an overlapping district of the pixel electrode and the transparent electrode;

wherein the first gate electrode, a layer of the first source electrode and the first drain electrode, and the etching stopper layer, the first semiconductor layer, and the gate isolation layer sandwiched between the first gate electrode and the layer of the first source electrode and the first drain electrode construct a first thin film transistor; the second gate, a layer of the second source electrode and the second drain electrode, and the etching stopper layer, the second semiconductor layer, and the gate isolation layer sandwiched between the second gate electrode and the layer of the second source electrode and the second drain electrode construct a second thin film transistor; and the transparent electrode, the pixel electrode and the flat isolation layer sandwiched transparent electrode and the pixel electrode construct a transparent capacitor; and wherein the transparent capacitor corresponds in position to and located under the opening of the pixel definition layer with the pixel electrode located on the flat top surface of the isolation layer and exposed through the opening and the transparent electrode located under and covered by the isolation layer and connected to the gate electrode of the second thin film transistor.

2. The pixel structure having high aperture ratio according to claim 1, wherein the transparent capacitor constructs an activation area part of the pixel structure.

3. The pixel structure having high aperture ratio according to claim 1, wherein the transparent electrode is an indium tin oxide (ITO) transparent electrode or an indium zinc oxide (IZO) transparent electrode, and the pixel electrode is an ITO pixel electrode or an IZO pixel electrode.

4. The pixel structure having high aperture ratio according to claim 1, further comprising a photoresist spacer located on the pixel definition layer.

5. The pixel structure having high aperture ratio according to claim 1, further comprising a first top gate electrode right over the first gate electrode and located between the protective layer and the isolation layer with the flat top surface, and a second top gate electrode right over the second gate electrode and located between the protective layer and the isolation layer with the flat top surface.

6. The pixel structure having high aperture ratio according to claim 5, wherein the first top gate electrode, the second top gate electrode and the transparent electrode are formed at the same time.

7. The pixel structure having high aperture ratio according to claim 1, wherein the first semiconductor layer is an indium gallium zinc oxide (IGZO) semiconductor layer, and the second semiconductor layer is an IGZO semiconductor layer.

* * * * *